US009316715B2

(12) United States Patent
Dupuis et al.

(10) Patent No.: US 9,316,715 B2

(45) Date of Patent: Apr. 19, 2016

(54) PROCESS AND SYSTEM FOR CALIBRATING A FIRST LOOP FEATURE VALUE ESTIMATION METHOD USING A FIRST LOCALLY MEASURABLE LOOP CHARACTERISTIC AND A FIRST SET OF PARAMETERS

(75) Inventors: Nicolas Dupuis, Chaudfontaine (BE); Benoit Drooghaag, Ophain-Bois-Seigneur-Isaac (BE)

(73) Assignee: Alcatel Lucent, Boulogne-Billancourt (FR)

( * ) Notice: Subject to any disclaimer, the term of this patent is extended or adjusted under 35 U.S.C. 154(b) by 133 days.

(21) Appl. No.: 13/995,303

(22) PCT Filed: Dec. 21, 2011

(86) PCT No.: PCT/EP2011/073641

§ 371 (c)(1), (2), (4) Date: Jun. 18, 2013

(87) PCT Pub. No.: WO2012/093033

PCT Pub. Date: Jul. 12, 2012

(65) Prior Publication Data

US 2013/0271154 A1 Oct. 17, 2013

(30) Foreign Application Priority Data

Jan. 3, 2011 (EP) .................................... 11305001

(51) Int. Cl.

*G01R 35/00* (2006.01)
*H04B 3/466* (2015.01)

(52) U.S. Cl.

CPC .............. *G01R 35/007* (2013.01); *H04B 3/466* (2013.01)

(58) Field of Classification Search

CPC .................................................... G01R 35/007

USPC ............................ 324/601; 375/222; 361/116

See application file for complete search history.

(56) References Cited

U.S. PATENT DOCUMENTS

| | | | | |
|---|---|---|---|---|
| 5,332,974 | A | 7/1994 | Harkins et al. | |
| 7,518,847 | B2 * | 4/2009 | Sharpe | 361/116 |
| 2006/0120442 | A1 * | 6/2006 | Melsa et al. | 375/222 |

FOREIGN PATENT DOCUMENTS

WO WO-2004/099711 A1 11/2004

OTHER PUBLICATIONS

International Search Report PCT/ISA/210 for International Application No. PCT/EP2011/073641 Dated Feb. 20, 2012.

Notice of Preliminary Rejection for corresponding Korean patent application No. 10-2013-7019746 dated Jun. 27, 2014 (in English).

* cited by examiner

*Primary Examiner* — Arleen M Vazquez

*Assistant Examiner* — Brent J Andrews

(74) *Attorney, Agent, or Firm* — Harness, Dickey & Pierce, P.L.C.

(57) ABSTRACT

A process for calibrating a first loop feature value estimation method using a first locally measurable loop characteristic and a first set of parameters, includes taking measurements of the first locally measurable loop characteristic for a plurality of loops, and obtaining a reference data set representing reference estimates of the loop feature value. The reference estimates are obtained by performing a calibrated second loop feature value estimation method using a second locally measurable loop characteristic and a second set of parameters. The method further includes determining calibrated parameters so as to minimize a deviation between the reference estimates and estimates obtained by applying the first estimation method to the measurements using the calibrated parameters as the first set of parameters.

19 Claims, 3 Drawing Sheets

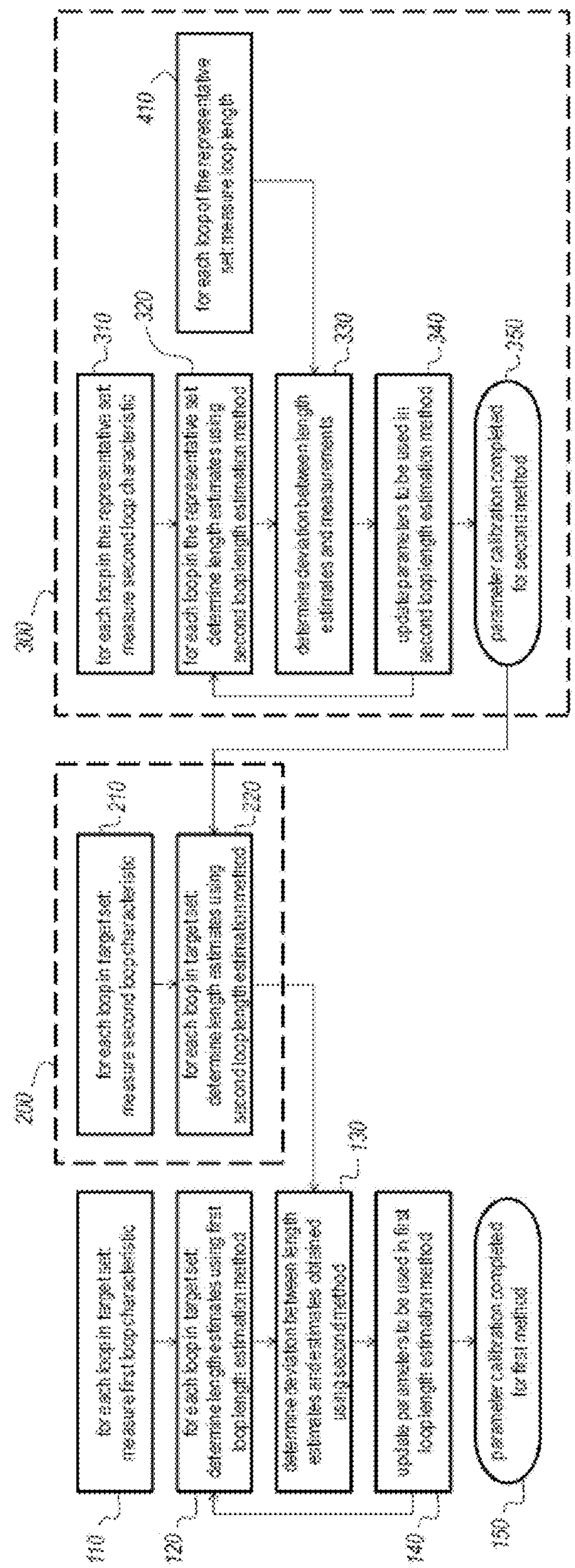
Figure 3
110
for each loop in target set: measure first loop characteristic
120
for each loop in target set: determine length estimates using first loop length estimation method
determine deviation between length estimates and estimates obtained using second method
130
140
update parameters to be used in first loop length estimation method
150
parameter calibration completed for first method
200
for each loop in target set: measure second loop characteristic
210
for each loop in target set: determine length estimates using second loop length estimation method
220
300
for each loop in the representative set: measure second loop characteristic
310
320
for each loop in the representative set: determine length estimates using second loop length estimation method
410
for each loop of the representative set: measure loop length
determine deviation between length estimates and measurements
330
update parameters to be used in second loop length estimation method
340
parameter calibration completed for second method
350

PROCESS AND SYSTEM FOR CALIBRATING A FIRST LOOP FEATURE VALUE ESTIMATION METHOD USING A FIRST LOCALLY MEASURABLE LOOP CHARACTERISTIC AND A FIRST SET OF PARAMETERS

FIELD OF INVENTION

The present invention pertains to the field of loop testing, in particular to the field of calibrating methods for assessing the quality of wireline loops used for data transmission.

BACKGROUND

Due to the increasing uptake of IP-TV, video-on-demand, and so-called triple-play (high-speed internet, telephony, and digital TV over a broadband link) services, the demands on the underlying network infrastructure become more stringent. These increasing demands must be approached both from a service provisioning point of view, i.e. by providing a network that is designed to offer the required performance, and from a customer support point of view, i.e. by deploying the necessary tools to detect and remedy performance problems that affect the quality of the service received by the end user.

SUMMARY

It is an object of embodiments of the present invention, to facilitate the calibration of a method used for estimating a feature value such as the loop length or the location of a defect of subscriber lines on the basis of locally measurable physical characteristics.

According to an aspect of the present invention, there is provided a calibration process for calibrating a first loop feature value estimation method using a first locally measurable loop characteristic and a first set of parameters, comprising: taking measurements of the first locally measurable loop characteristic for a first plurality of loops; obtaining a reference data set representing reference estimates of the feature value, the reference estimates being obtained by performing a calibrated second loop feature value estimation method using a second locally measurable loop characteristic and a second set of parameters; and determining calibrated parameters so as to minimize a deviation between the reference estimates and estimates that can be obtained by applying the first loop feature value estimation method to the measurements using the calibrated parameters as the first set of parameters.

It is thus an advantage of the present invention that the first loop feature value estimation method may be calibrated using a relative large calibration data set, without having to resort to a large number of traditional (i.e. non-local) loop feature value measurements. The feature value may inter alia be the length of the loop, the location of one or more defects such as a short-circuit, the location of one or more bridged taps, gauge changes, resistivity changes, etc. The locally measurable characteristics may include one or more of a resistance, a capacitance, an inductance, an impulse response diagram, etc.

The stated advantage is achieved by generating the calibration data set by means of a second loop feature value estimation method, which has been calibrated in advance. The process according to the present invention is particularly advantageous if the calibration of the second loop feature value estimation method has already been performed in the past, if it is more accurate, or if it easier than a direct calibration of the first loop feature value estimation method.

In an embodiment, the calibration process of the present invention further comprises obtaining a verification data set representing verification estimates of feature values of the first plurality of loops, the verification estimates being obtained by applying the first loop feature value estimation method to the measurements using uncalibrated parameters as the first set of parameters, wherein the determining of the calibrated parameters comprises updating the calibrated parameters so as to minimize a deviation between the verification estimates and the reference estimates.

Any iterative algorithm for calibrating the parameters of the first loop feature value estimation method will require some initial value to operate on. It is therefore advantageous to use a predetermined set of parameters which may correspond to rough estimates of the actual parameters, which rough estimates may be derived from a theoretical physical model of the loops.

In an embodiment of the calibration process according to the present invention, the obtaining the second data set comprises measuring feature values of a second plurality of loops; determining the second set of parameters so as to minimize a deviation between the feature values of the second plurality and estimates of the feature values obtained by performing the second loop feature value estimation method; wherein the electrical properties of the second plurality of loops are substantially representative of the electrical properties of the first plurality of loops.

It is an advantage of this embodiment that it includes the calibration of the second loop feature value estimation method, which is efficiently carried out in substantially the same way as the calibration of the first loop feature value estimation method, but optionally using a different set of loops.

In a specific embodiment, the second plurality of loops is a subset of the first plurality of loops.

In an embodiment of the calibration process according to the present invention, the first loop feature value estimation method or the second loop feature value estimation method comprises a MELT method.

In a specific embodiment, the MELT method uses a parameter set including a lineic differential capacitance and a lineic common-mode capacitance.

MELT is well-known and accurate loop length estimation method, described in more detail herein, which may advantageously be calibrated with a relatively small set of parameters.

In an embodiment of the calibration process according to the present invention, the first loop feature value estimation method or the second loop feature value estimation method comprises a SELT method.

In a specific embodiment, the SELT method uses a parameter set including a lineic serial resistance, a lineic serial inductance, a lineic parallel conductance, and a lineic parallel capacitance.

SELT is another well-known and accurate method for estimating such feature values as aggregate loop length, loop branching topology, defect locations, and terminal resistance. It is described in more detail herein. SELT may advantageously be calibrated with a relatively small set of parameters.

In an embodiment of the calibration process according to the present invention, the loop feature comprises a loop length.

According to another aspect of the present invention, there is provided a computer program product comprising processor-executable instructions which, when executed, perform the calibration process according to the invention as described above.

According to another aspect of the present invention, there is provided a system for calibrating a first loop feature value estimation method using a first locally measurable loop characteristic and a first set of parameters, comprising a first measurement device for measuring a first locally measurable physical characteristic; a first loop feature value estimation processor, operatively connected to the first measurement device and to a first parameter memory, the first loop feature value estimation processor being adapted to produce a first loop feature value estimate by means of a first loop feature value estimation method on the basis of the first measurable physical characteristic and a first parameter set contained in the first parameter memory; a second measurement device for measuring a second locally measurable physical characteristic; a second loop feature value estimation processor, operatively connected to the second measurement device and to a second parameter memory, the second loop feature value estimation processor being adapted to produce a second loop feature value estimate by means of a second loop feature value estimation method on the basis of the second measurable physical characteristic and a second parameter set contained in the second parameter memory; and means for using the first loop feature value estimate and the second loop feature value estimate to update the first parameter set such that loop feature value estimates subsequently obtained by the first loop feature value estimation processor substantially coincide with loop feature value estimates obtained by the second loop feature value estimation processor.

In an embodiment of the system according to the present invention, the first loop feature value estimation method or the second loop feature value estimation method comprises a MELT method.

In a specific embodiment, the MELT method uses a parameter set including a lineic differential capacitance and a lineic common-mode capacitance.

In an embodiment of the system according to the present invention, the first loop feature value estimation method or the second loop feature value estimation method comprises a SELT method.

In a specific embodiment, the SELT method uses a parameter set including a lineic serial resistance, a lineic serial inductance, a lineic parallel conductance, and a lineic parallel capacitance.

The advantages of the various embodiments of the computer program product and the system according to the present invention correspond mutatis mutandis to those previously mentioned in connection with the process according to the invention.

BRIEF DESCRIPTION OF THE FIGURES

Some embodiments of apparatus and/or methods in accordance with embodiments of the present invention are now described, by way of example only, and with reference to the accompanying drawings, in which:"

FIG. 3 is a flow chart of a method according to an embodiment of the present invention;

DESCRIPTION OF EMBODIMENTS

Ideally, a network diagnostic tool is capable of both remotely diagnosing sources of physical problems and taking actions to improve the performance. This helps the operators to gain in quality of service and save time and money by avoiding human interventions for a number of problems.

The present invention is concerned with the estimation of loop feature values. The feature value may inter alia be the length of the loop, the location of one or more defects such as a short-circuit, the location of one or more bridged taps, gauge changes, resistivity changes, etc. These properties of the loop plant are typically very difficult to measure "in the field", so an estimation on the basis of a measurement of a locally measurable physical characteristic is highly preferred.

For services offered over metallic wireline channels, such as the twisted-pair telephone wires used for the various xDSL flavors, a key feature of remote testing resides in the estimation of the loop length. This loop length determines the attenuation of the signal between the sender and the receiver, and therefore determines the achievable bit rate to an important extent. Techniques for estimating loop length include "metallic line testing" (MELT) and "single-ended line testing" (SELT).

Embodiments of the present invention will hereinafter be described in the context of a method to estimate the length of loops. This is done for clarifying purposes only, and should not be understood as limiting the invention. Every embodiment described for the purpose of calibrating loop length estimation methods should be understood as including analogous embodiments for the purpose of calibrating other loop feature value estimation methods.

Figure 1:
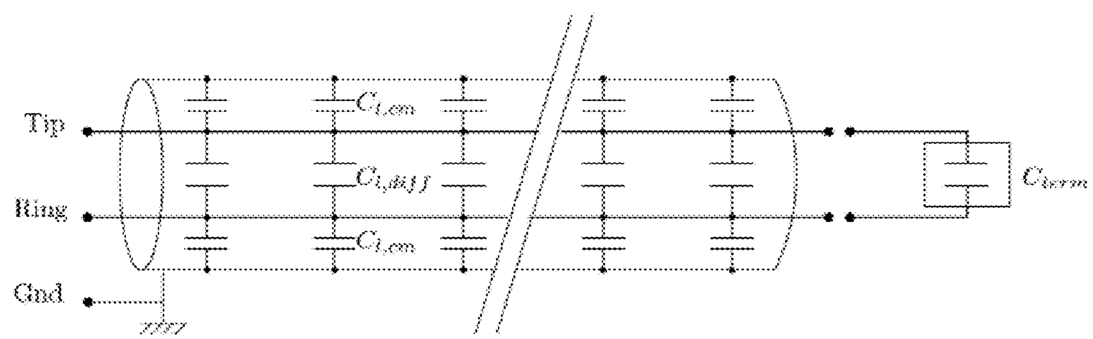
FIG. 1 provides a schematic representation of a low-frequency transmission line model as used in the MELT method.

MELT essentially carries out an estimation based on the measurement of electrical parameters according to a low-frequency model. This model is schematically illustrated in FIG. 1. In particular, common mode capacitance per unit of length ($C_{l,cm}$) and differential capacitance per unit of length ($C_{l,diff}$) are empirically determined for the cable type of interest, and the length (l) of a particular cable can be estimated from the cable's measured common mode capacitance ($C_{cm,measured}$) and differential capacitance ($C_{diff,measured}$) according to the following equations:

$$C_{diff,measured}=l\cdot C_{l,cm}+C_{term}$$

$$C_{cm,measured}=l\cdot C_{l,cm}$$

Figure 2:
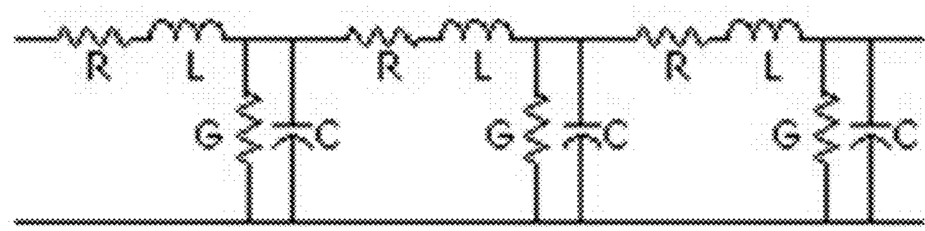
FIG. 2 provides a schematic representation of a high-frequency transmission line model as used in the SELT method.

Values for $C_{l,diff}$ and $C_{l,cm}$ may for instance be around 50 nF/m. SELT relies on reflectometry to estimate the characteristics of the line. The reliability of the estimations depends on the line calibration. To determine how the timing of various detected "reflection" of a test signal represent the line's length (or other topological features), an assumption must be made about the velocity of the signal propagation over the line. This velocity assumption requires calibration. With reference to FIG. 2, the high-frequency transmission line model underlying the SELT methodology can be expressed as follows:

$$l = v \cdot t_r$$

$$t_r = \frac{t_{end} - t_0}{2}$$

-continued $$\text{as } \gamma = \alpha + j\beta = \sqrt{(R + j\omega L)(G + j\omega C)}$$

$$\text{and } v = \frac{\omega}{\beta}$$

$$\text{then } v(f) = F(R(f), L(f), C(f), G(f))$$

where v represents the electrical signal velocity on the medium; $t_{end}$ represents the time of the local detection of the reflection, generated by the end of the loop, of an impulse transmitted at time $t_0$, the reflection occurring at time $t_r$; f represents the frequency at which resistance R, inductance L, capacitance C, and conductance G are measured, f being related to the annular frequency ω by the relation ω=2πf; and α, β, and γ are auxiliary variables defined in function of R, L, G, and C as indicated.

Typically, the calibration is performed through lab measurements where lines of different loop lengths and termination impedances are tested in order to create a time-space model from data. A manual refining of the calibration process can also be performed directly in the fields on specific loops to gain in accuracy. Consequently, this process, which requires precise lab tests and field interventions, is time consuming.

Both approaches suffer from many types of errors, including systematic errors resulting from imperfect calibration or discrepancies between the real-world situation and the modeled parameter values. It is therefore an object of embodiments of the present invention to reduce some of these errors by performing an automatic cross-calibration, which serves to detect and compensate the calibration defects and therefore notably improves loop length estimation and/or the model parameters.

FIG. 3 illustrates an embodiment of the method according to the present invention. A primary part of the invention is represented by the steps labeled 110-150. The blocks labeled 200 and 300 represent optional blocks. The order in which the various steps are represented is purely exemplary, and does not limit the invention, unless it is clear from the following description that a particular step cannot take place before another step has completed. The skilled person will also appreciate that certain steps may be combined, and their combined result may be achieved in a mathematically equivalent way by performing different operations on the input data. Such embodiments are also within the scope of the present invention.

The purpose of the illustrated embodiment is to determine parameters to be used in a first parametric loop length estimation method. This first loop length estimation method serves to determine the length of one or more loops, i.e. the target set, by measuring a locally measurable physical characteristic, which is illustrated as a first step 110.

The determination of the parameters is performed in the fourth illustrated step 140. In order to make this determination, estimates of the loop lengths, obtained through the first loop length estimation method in the second illustrated step 120, are compared in the third illustrated step 130 to reference estimates that are obtained from the optional block 200, which is described in more detail below. The skilled person will appreciate that if the optional block 200 is not present, reference estimates that have been established earlier may for instance be obtained from a memory.

The comparison 130 between the estimates obtained by the first loop length estimation method in second step 120 and the reference estimates 200 may consist of determining a linear regression coefficient. If this approach is taken, the parameters are determined 140 in such a way as to bring the linear regression coefficient closer to 1. The skilled person will appreciate that other suitable algorithms may be used to obtain the appropriate parameters 140 from the measured deviation 130 between the estimated lengths and the reference estimates. Several iterations of steps 120, 130 and 140 may have to be applied, before the parameters are sufficiently reliable.

Once the parameter determination 140 has taken place, optionally through an iterative process, the parameter calibration for the first loop length estimation method is considered completed 150.

For certain choices of the first loop length estimation method, it may be efficient to mathematically derive the first parameter set directly from the reference estimates and the measured physical characteristics, thus effectively combining the illustrated steps 120-140 in a single, not necessarily iterative operation.

Optional block 200 illustrates how the reference estimates may be obtained. Advantageously, a second parametric loop length estimation method is applied, which relies on a second locally measurable physical characteristic of the loop. The second loop length estimation method is assumed to be calibrated in advance. This calibration may take place through the steps shown in the optional block 300, described in more detail below. The skilled person will appreciate that other known calibration procedures may be applied with the same effect.

The second physical characteristic of each loop of the target set is measured in step 210. On the basis of these characteristics, loop length estimates are obtained by means of the second loop length estimation method in step 220. These estimates serve as the reference estimates for the calibration of the first loop length estimation method, as described before.

The first loop length estimation method may be a SELT method, and the second loop length estimation method may be a MELT method, or vice versa. The skilled person will appreciate that other loop length estimation methods may be used as the first and/or the second loop length estimation method, without departing from the underlying insights of the invention.

It is thus an advantage of the present invention that the first loop length estimation method may be calibrated using a relative large calibration data set, without having to resort to a large number of traditional (i.e. non-local) loop length measurements. This advantage is achieved by generating the calibration data set by means of a second loop length estimation method, which has been calibrated in advance. The process according to the present invention is particularly advantageous if the calibration of the second loop length estimation method has already been performed in the past, if it is more accurate, or if it easier than a direct calibration of the first loop length estimation method.

The second loop length estimation method may have been calibrated according to the steps illustrated in optional block 300. This calibration relies on known loop lengths of a representative set of loops. These known loop lengths may have been obtained by means of a non-local measurement method, e.g. by using a traditional measuring rod, an optical measurement, etc., or by measurements during production and/or installation of the loop. These ways to obtain the actual length of the loop are symbolized by the measurement step 410. The known loop lengths of the representative set are used as a reference to verify the estimated loop lengths obtained by means of the first loop length estimation method obtained in step 320, which rely on the local measurement of the second physical characteristic carried out in step 310. In a way that is fully analogous to the calibration that has been described in connection with the first loop length estimation method, illustrated as steps 120-140, the second loop length estimation method is calibrated on the basis of the known loop lengths.

The representative set may be a subset of the target set. However, the representative set may also be a completely different set of loops, for instance a set of loops available in a laboratory, used especially for calibration purposes. The representative set preferably comprises loops of the same type and/or gauge as those of the target set. The representative set preferably comprises loops whose range of lengths substantially coincides with the range of lengths of the target set.

A person of skill in the art would readily recognize that steps of various above described methods can be performed by programmed computers. Herein, some embodiments are also intended to cover program storage devices, e.g., digital data storage media, which are machine or computer readable and encode machine executable or computer-executable programs of instructions, wherein said instructions perform some or all of the steps of said above-described methods. The program storage devices may be, e.g., digital memories, magnetic storage media such as a magnetic disks and magnetic tapes, hard drives, or optically readable digital data storage media. The embodiments are also intended to cover computers programmed to perform said steps of the above-described methods.

Figure 4:
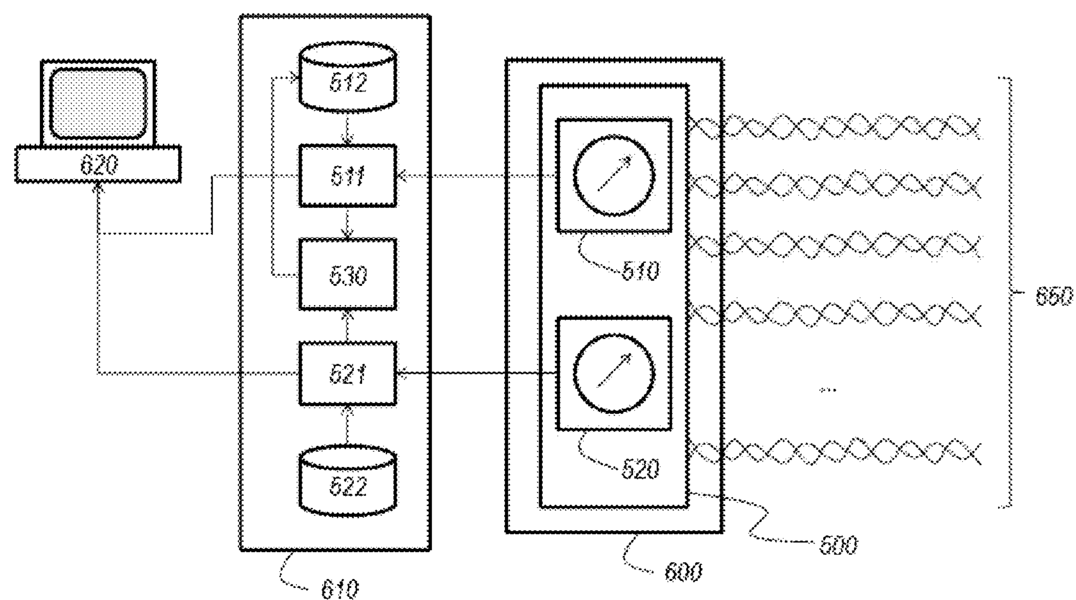
FIG. 4 is a block diagram of a system according to an embodiment of the present invention.

A system according to an embodiment of the present invention is illustrated in FIG. 4. FIG. 4 shows a part of a metallic access network, including a plurality of metallic twisted-pair lines 650 that may be used to connect subscriber equipment to an access node 600. With reference to the preceding description of the embodiment of the method according to the invention illustrated in FIG. 3, the illustrated twisted-pair lines 650 are assumed to be the loops of the target set.

Without loss of generality, a measurement unit 500 is illustrated as being integrated in the access node 600, though this unit 500 may also be a stand-alone piece of equipment or integrated in another device. The measurement unit 500 includes at least a first measurement device 510 for measuring the first measurable physical characteristic and a second measurement device 520 for measuring the second measurable physical characteristic, for each of the loops of the target set.

Each of the measurement units 510, 520 is connected to a respective loop length estimation processor 511, 521, performing the first and second loop length estimation method, respectively.

The first loop length estimation processor 511 relies on a set of parameters stored in a first parameter memory 512. This memory is initially empty, or it may for example be pre-programmed with a set of roughly estimated parameters.

The second loop length estimation processor 512 relies on a set of parameters stored in a second parameter memory 522. This memory is assumed to be populated with an accurate set of parameters, i.e. the second loop length estimation processor 512 is assumed to be well calibrated.

The skilled person will appreciate that first parameter memory 512 and second parameter memory 522 may be implemented as a different sets of variables stored in the same physical memory, or in different physical memories.

Both loop length estimation processors 511, 521 are operatively coupled to a calibration processor 530, which is adapted to compare the estimates obtained by means of both loop length estimation methods, and to determine a set of parameters to obtain a best fit of the results of the processor under calibration 511 and the reference value of the pre-calibrated processor 521. The updated parameters are stored in the first parameter memory 512. The determination of the updated parameters for the first loop length estimation processor may be carried out in an iterative way.

Stated more generally, the calibration processor 530 is in fact a specific means that uses the first loop length estimate (obtained from the first loop length estimation processor 511) and the second loop length estimate (obtained from the second loop length estimation processor 521) to update the first parameter set such that loop length estimates subsequently obtained by the first loop length estimation processor 511 substantially coincide with loop length estimates obtained by the second loop length estimation processor 521. This means that the estimates obtained from the second processor 521 are used to calibrate the parameters used by the first processor 511.

Without loss of generality, the processors 511, 521, and 530 are illustrated as separate blocks. This does not imply that they have to be implemented as separate components.

In particular, blocks 511 and 530 may also be functionally merged to provide a mathematically equivalent result in an operationally different way. Hence, depending on the choice of the first loop length estimation method, it may be computationally efficient to derive the first parameter set directly from the available data, viz. the measurement data obtained from the first measurement device 510 and the reference estimates obtained from the second loop length estimation processor 521. Such an arrangement is also within the scope of the present invention.

The output of both loop length estimation processors 511, 521 may be relayed to a network management station 620 in the known manner, to allow a network operator to draw any useful conclusions from the estimates obtained from these processors. This is of particular relevance after the calibration process, when loop length estimates are being produced for loops that have not taken part in the calibration.

The number of parameters used in the loop length estimation methods that are part of the process and the system of embodiments of the present inventions, depends on the actual selected methods. Specific parameters sets that may be used for known SELT and MELT methods are provided above.

The size of the target set of loops over which the first loop length estimation method is calibrated will be judiciously selected by the user of the process or the system of the present invention, in function of the selected method and in accordance with the number of parameters that need to be determined.

Figure 5:
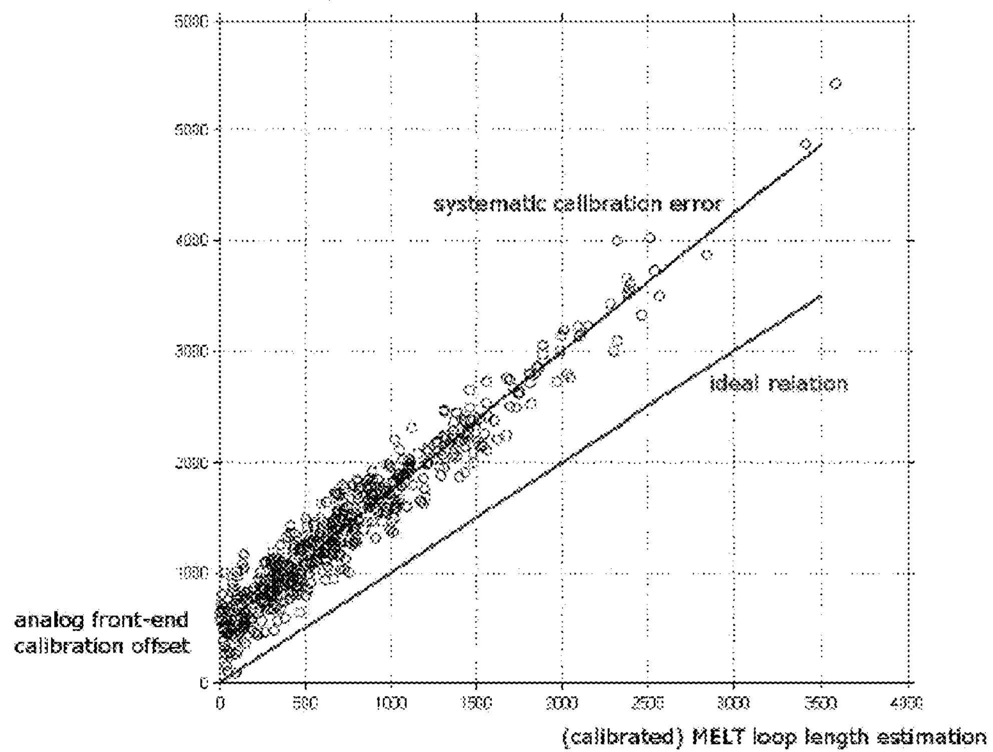
FIG. 5 is a scatter plot of representing pairs of loop length estimates obtained by applying two different loop length estimation methods.

FIG. 5 is a scatter plot of representing pairs of loop length estimates obtained by applying two different loop length estimation methods. The horizontal axis represents a loop length estimated by applying a calibrated MELT method, and the vertical axis represents the corresponding loop lengths obtained by applying an uncalibrated SELT method. Without loss of generality, the measurement units on both axes are assumed to be meters. Ideally, the length estimates obtained by the two methods should be identical, which would result in the straight line passing through the origin with slope 1. However, a linear regression of the available exemplary data sets reveals that the actual relationship is better approximated by a straight line with a y-axis intercept of approximately 500 m, and a slope slightly in excess of 1. The non-zero y-axis intercept can be physically explained as a calibration offset of the analog front-end of the SELT system. The slope error must be considered as a systematic calibration error. In cases such as the one illustrated here, the purpose of the calibration process according to the invention would be to adapt the parameters of the SELT system in such a way that further estimates that are obtained would substantially coincide with the corresponding calibrated MELT estimates.

The functions of the various elements shown in the figures, including any functional blocks labeled as "processors", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

The invention claimed is:

1. A calibration process for calibrating a first loop feature value estimation method using a first locally measurable loop characteristic and a first set of parameters, comprising:

taking measurements of said first locally measurable loop characteristic for a first plurality of loops;

obtaining a reference data set representing reference estimates of said loop feature value, said reference estimates being obtained by performing a calibrated second loop feature value estimation method using a second locally measurable loop characteristic and a second set of parameters, the first loop feature value estimation method and the second loop feature value estimation method being different methods; and determining calibrated parameters so as to minimize a deviation between said reference estimates and estimates that can be obtained by applying said first loop feature value estimation method to said measurements using said calibrated parameters as said first set of parameters.

2. The calibration process according to claim 1, further comprising obtaining a verification data set representing verification estimates of feature values of said first plurality of loops, said verification estimates being obtained by applying said first loop feature value estimation method to said measurements using uncalibrated parameters as said first set of parameters, wherein said determining of said calibrated parameters comprises updating said calibrated parameters so as to minimize a deviation between said verification estimates and said reference estimates.

3. The calibration process according to claim 1, wherein said obtaining said reference data set comprises:

measuring feature values of a second plurality of loops; and determining said second set of parameters so as to minimize a deviation between said feature values of said second plurality and estimates of said feature values obtained by performing said second loop feature value estimation method;

wherein the electrical properties of said second plurality of loops are substantially representative of the electrical properties of said first plurality of loops.

4. The calibration process according to claim 3, wherein said second plurality of loops is a subset of said first plurality of loops.

5. The calibration process according to claim 1, wherein said first loop feature value estimation method or said second loop feature value estimation method comprises a MELT method.

6. The calibration process according to claim 5, wherein said MELT method uses a parameter set including a lineic differential capacitance and a lineic common-mode capacitance.

7. The calibration process according to claim 1, wherein said first loop feature value estimation method or said second loop feature value estimation method comprises a SELT method.

8. The calibration process according to claim 7, wherein said SELT method uses a parameter set including a lineic serial resistance, a lineic serial inductance, a lineic parallel conductance, and a lineic parallel capacitance.

9. The calibration process according to claim 1, wherein said loop feature comprises a loop length.

10. Computer program product comprising processor-executable instructions which, when executed, perform the calibration process of claim 1.

11. System for calibrating a first loop feature value estimation method using a first locally measurable loop characteristic and a first set of parameters, comprising:

a first measurement device for measuring a first locally measurable physical characteristic;

a first loop feature value estimation processor, operatively connected to said first measurement device and to a first parameter memory, said first loop feature value estimation processor being adapted to produce a first loop feature value estimate by means of a first loop feature value estimation method on the basis of said first measurable physical characteristic and a first parameter set contained in said first parameter memory;

a second measurement device for measuring a second locally measurable physical characteristic;

a second loop feature value estimation processor, operatively connected to said second measurement device and to a second parameter memory, said second loop feature value estimation processor being adapted to produce a second loop feature value estimate by means of a second loop feature value estimation method on the basis of said second measurable physical characteristic and a second parameter set contained in said second parameter memory, the first loop feature value estimation method and the second loop feature value estimation method being different methods; and means for using said first loop feature value estimate and said second loop feature value estimate to update said first parameter set such that loop feature value estimates subsequently obtained by said first loop feature value estimation processor substantially coincide with loop feature value estimates obtained by said second loop feature value estimation processor.

12. The system according to claim 11, wherein said first loop feature value estimation method or said second loop feature value estimation method comprises a MELT method.

13. The system according to claim 12, wherein said MELT method uses a parameter set including a lineic differential capacitance and a lineic common-mode capacitance.

14. The system according to claim 11, wherein said first loop feature value estimation method or said second loop feature value estimation method comprises a SELT method.

15. The system according to claim 12, wherein said SELT method uses parameter set including a lineic serial resistance, a lineic serial inductance, a lineic parallel conductance, and a lineic parallel capacitance.

16. The calibration process of claim 1, wherein the first loop feature value estimation method is a MELT method and the second loop feature value estimation method is a SELT method.

17. The calibration process of claim 1, wherein the first loop feature value estimation method is a SELT method and the second loop feature value estimation method is a MELT method.

18. The system of claim 11, wherein the first loop feature value estimation method is a MELT method and the second loop feature value estimation method is a SELT method.

19. The system of claim 11, wherein the first loop feature value estimation method is a SELT method and the second loop feature value estimation method is a MELT method.

* * * * *